United States Patent [19]

Heinke

[11] Patent Number: 6,008,693
[45] Date of Patent: Dec. 28, 1999

[54] FM-SOUND DEMODULATOR FOR TV SOUND SIGNALS AND METHOD OF DETECTING SOUND CARRIERS

[75] Inventor: Burkhard Heinke, Neu Wulmstorf, Germany

[73] Assignee: U.S. Philips Corporation, New York, N.Y.

[21] Appl. No.: 09/030,485

[22] Filed: Feb. 25, 1998

[30] Foreign Application Priority Data

Feb. 28, 1997 [DE] Germany ............................. 197 08 059

[51] Int. Cl.$^6$ .............................. H03D 3/00; H03L 7/095; H04N 5/46; H04N 5/52
[52] U.S. Cl. ........................... 329/325; 329/321; 331/12; 331/23; 331/DIG. 2; 348/726; 348/735; 348/738; 455/209; 455/210; 455/214; 455/337
[58] Field of Search ..................................... 329/321, 325, 329/326; 331/10–12, 23, DIG. 2; 348/726, 727, 735, 738; 455/205, 208–210, 214, 337

[56] References Cited

U.S. PATENT DOCUMENTS 5,631,601  5/1997  Horsfall et al. ......................... 329/325

Primary Examiner—David Mis
Attorney, Agent, or Firm—Michael E. Belk

[57] ABSTRACT

For a possible simple structure, dispensing with ceramic filters, an FM demodulator for demodulating sound-FM signals comprises a controllable amplifier (1) which receives the sound signals converted to intermediate frequencies, said amplifier having a gain which is adjusted by means of an amplitude control circuit (4) and whose output signal is applied to the amplitude control circuit and to the phase-locked loop which supplies a demodulated sound signal in the locked-in state from its output, said phase-locked loop including a loop filter (7) which comprises a filter (8, 9, 10) of at least the second order with a pole at the frequency $f=0$, and a limit-detection circuit (13) which feeds back the operating frequency of the phase-locked loop to a predetermined frequency range when said phase-locked loop leaves this frequency range around a predeterminable nominal demodulation frequency, the amplitude control circuit (4) controlling the controllable amplifier (1) in dependence upon its output signal and a signal dependent on the frequency of the output signal of a voltage-controlled oscillator (14) in the phase-locked loop in such a way that the output signals of the controllable amplifier (1) have a nominal amplitude.

9 Claims, 2 Drawing Sheets

FM-SOUND DEMODULATOR FOR TV SOUND SIGNALS AND METHOD OF DETECTING SOUND CARRIERS

FIELD OF THE INVENTION

The invention relates to an FM demodulator for demodulating FM sound signals of a picture signal, preferably an IF picture signal, comprising a phase-locked loop. The invention also relates to a method of detecting FM sound carriers by means of such an FM demodulator.

Picture signals generally comprise a sound signal which is frequency-modulated. However, in the different television standards, the frequency gap between the carrier frequency of the picture carrier and the carrier frequency of the sound carrier(s) is different. An FM sound demodulator for such signals must therefore be tuned to different frequencies for the FM sound carriers. The same applies to the demodulation of sound signals, also when a picture signal has already been converted to the intermediate-frequency range.

BACKGROUND OF THE INVENTION

Known FM demodulators for FM sound signals of a picture signal operate with a limiter-amplifier preceding a PLL. However, in response to the limiter at the input of the circuit arrangement, the overall arrangement has no selectivity. Ceramic filters are required for filtering the FM sound carriers. These ceramic filters require a relatively high number of technical components and cannot be realized in integrated circuits. Moreover, every possible FM sound carrier frequency requires its own ceramic filter. Such a circuit arrangement is known, for example, from the Philips IC TDA9820 plus external circuits.

SUMMARY OF THE INVENTION

It is an object of the invention to provide an FM demodulator without a ceramic filter in a possibly simple circuit which can be integrated and used for detecting FM sound carriers.

According to the invention, this object is solved in that a controllable amplifier is provided which receives the sound signals converted to intermediate frequencies, said amplifier having a gain which is adjusted by means of an amplitude control circuit and whose output signal is applied to the amplitude control circuit and to the phase-locked loop which supplies a demodulated sound signal in the locked-in state from its output, said phase-locked loop including a loop filter which comprises a filter of at least the second order with a pole at the frequency f=0, and a limit-detection circuit which feeds back the operating frequency of the phase-locked loop to a predetermined frequency range when said phase-locked loop leaves this frequency range around a predeterminable nominal demodulation frequency, the amplitude control circuit controlling the controllable amplifier in dependence upon its output signal and a signal dependent on the frequency of the output signal of a voltage-controlled oscillator in the phase-locked loop in such a way that the output signals of the controllable amplifier have a nominal amplitude.

The circuit arrangement according to the invention comprises a controllable amplifier which is controlled by means of an amplitude control circuit in such a way that its output signals have a nominal amplitude. In this case, only a gain control is concerned rather than a limitation of the signals which are applied to the controllable amplifier. The controllable amplifier precedes a phase-locked loop which includes a loop filter comprising a filter of at least the second order. This filter has a pole at the zero frequency and has thus a theoretically infinitely high DC gain.

In contrast to the prior art, this phase-locked loop has its own selectivity which operates linearly. The bandwidth of the phase-locked loop is dependent on the amplitude of the input signal which is controlled at a desired value by means of the controllable amplifier and the amplitude control circuit. In contrast to the prior art circuit arrangement, the PLL is capable of filtering a given FM sound carrier at a given frequency and of locking in on this carrier, i.e. the frequency of the phase-locked loop is synchronized with the frequency of this carrier.

As it is not always known which television standard with a picture signal and FM sound carrier is received, whose FM sound carrier is to be demodulated, an additional limit-detection circuit is provided which signalizes when the operating frequency of the phase-locked loop, i.e. the frequency at which the phase-locked loop is locked in, leaves a predeterminable frequency range around the adjusted FM sound carrier frequency, i.e. the nominal demodulation frequency. This provides the possibility of detecting the actual absence of an FM sound carrier of the adjusted nominal demodulation frequency. This is possible because the PLL locks in on an FM sound carrier in the case where this carrier actually has the nominal demodulation frequency adjusted in the limit-detection circuit and where the operating frequency of the phase-locked loop does not leave the frequency range around this nominal demodulation frequency. The operating frequency of the phase-locked loop only "drifts" away from the predetermined frequency range when such a sound carrier of the predetermined nominal demodulation frequency is not present. This is detected by the limit-detection circuit whose signal may be used for a systematic FM sound carrier detection.

In accordance with an embodiment of the invention, two current sources are provided which can supply currents of different signs and different values to the loop filter, while in the case where the operating frequency of the phase-locked loop leaves the frequency range around the nominal demodulation frequency, the limit-detection circuit controls the current sources in such a way that the operating frequency of the phase-locked loop is fed back again to the predetermined frequency range around the nominal demodulation frequency.

To enhance the reliability of the circuit according to the invention as far as interference is concerned, it may be useful not to perform an evaluation when the limits of the predetermined frequency range have been exceeded once, but to attempt to maintain the operating frequency of the phase-locked loop within the predetermined frequency range. To this end, it is advantageous that in the case where a limit of the frequency range around the nominal demodulation frequency is left the limit-detection circuit supplies such current pulses by means of the current sources to the filter of the loop filter that a voltage-controlled oscillator arranged in the phase-locked loop operates again in a frequency range which lies within the predetermined frequency range. The phase-locked loop is then quasi-forcefully fed back to this frequency range again. This process may be repeated several times. If the operating frequency of the phase-locked loop had no result in the predetermined frequency range, even after several times of feedback, it can be assumed with greater certainty that there is no FM sound carrier in the predetermined frequency range.

In accordance with a further embodiment of the invention, the limit-detection circuit comprises an adjustable counter which, at the start of a measuring cycle, is set at an initial value dependent on the nominal demodulation frequency and, during the measuring cycle, continues to count in dependence upon the phase-locked loop signal, and an evaluation logic which, after the measuring cycle, controls the current sources in dependence upon the count reached by the counter.

The operating frequency of the oscillator of the phase-locked loop can thus be simply detected by means of a counter. At the start of a measuring cycle, the counter is set to a defined initial value which is dependent on the nominal demodulation frequency. During the measuring cycle, the counter continues to count in dependence upon the signal from the oscillator in the phase-locked loop. At the end of the measuring cycle, having a defined length, an evaluation logic evaluates the count then reached. This count is a direct measure of the extent to which the oscillation frequency of the voltage-controlled oscillator in the phase-locked loop deviates from the nominal demodulation frequency. Since the initial count is selected in dependence upon the nominal demodulation frequency, the counter reaches a given nominal count at the end of the measuring cycle, when this nominal demodulation frequency is actually present. If the operating frequency of the phase-locked loop is actually higher, this nominal count is exceeded and if it is lower, the value falls below this count. Conclusions about the operating frequency of the phase-locked loop can directly be drawn from these deviations.

An extremely simple detection of the operating frequency of the phase-locked loop is possible in this way.

In a further embodiment of the invention, the current source supplying a positive current pulse to the loop filter is activated by the evaluation logic during a predetermined period of time in the case where the count falls below a predetermined lower limit value after the measuring cycle has finished, and the current source supplying a negative current pulse to the loop filter is activated by the evaluation logic during a predetermined period of time in the case where the count exceeds a predetermined upper limit value after the measuring cycle has finished.

Since, as explained above, the count after the end of the measuring cycle indicates the extent to which the operating frequency of the phase-locked loop deviates from the nominal demodulation frequency, the count may be used for feeding back the operating frequency of the phase-locked loop to the predetermined frequency range around the nominal demodulation frequency again.

This can be effected by means of the current sources described above, which supply either a positive or a negative current pulse to the loop filter in dependence upon the sign of the deviation of the operating frequency from the nominal demodulation frequency, so that the operating frequency of the phase-locked loop is directly fed back to the predetermined frequency range.

This may be useful when it should be found out via several measuring cycles whether a nominal demodulation frequency is detected. As already explained hereinbefore, this repeated control is not required when an FM sound carrier is actually present at or near the preselected nominal demodulation frequency, because then the phase-locked loop locks in on this carrier and does not leave the predetermined frequency range around the nominal demodulation frequency.

According to the invention, a method of detecting FM sound carriers at different FM carrier frequencies in a picture signal with FM sound carriers, preferably an IF picture signal, using the FM demodulator according to the invention is characterized in that the FM demodulator is controlled to detect an FM sound carrier at a nominal demodulation frequency in such a way that an FM sound carrier at the nominal demodulation frequency is detected in the case where the limit-detection circuit detects that the operating frequency of the phase-locked loop does not leave the predetermined frequency range around the nominal demodulation frequency, and another nominal demodulation frequency for which the detection process is repeated is selected in the case where the limit-detection circuit detects that the operating frequency of the phase-locked loop leaves the predetermined frequency range around the nominal demodulation frequency.

In this method it is evaluated whether the limit-detection circuit detects the situation where the phase-locked loop leaves the predetermined frequency range around the nominal demodulation frequency. As explained above, the FM demodulator according to the invention and its limit-detection circuit can directly supply a signal signalizing this situation. For the inventive method of detecting an FM sound carrier, this means that the FM demodulator according to the invention and its limit-detection circuit are initially adjusted at a nominal demodulation frequency at which an FM sound carrier is suspected. The limit-detection circuit of the FM demodulator subsequently detects whether the phase-locked loop of the FM demodulator locks in on such a sound carrier in the predetermined frequency range around this nominal demodulation frequency. The actual presence of an FM sound carrier is then deduced from this signal.

If an FM sound carrier is detected at the nominal demodulation frequency, the adjusted nominal demodulation frequency is not changed and the FM demodulator supplies the demodulated sound signal for further processing from its output. However, when such an FM sound signal is not detected, the FM demodulator is adjusted at another nominal demodulation frequency at which an FM sound carrier is suspected. This process is repeated until an FM sound carrier is detected.

The control of the FM demodulator in accordance with this method allows simple detection of the television standard of the received picture signal. In fact, the television standard can be directly deduced from the FM sound carrier frequency because there are different FM sound carrier frequencies for different television standards.

In accordance with a further embodiment of the invention, a predetermined number of, preferably ten, measuring cycles is performed without evaluation of the results before the decisive detection measuring cycle is performed, whose result is evaluated.

The detection reliability is enhanced when ten measuring cycles are performed in this way. It is thus ascertained that, for example an incidental disturbance of the phase-locked loop does not have the result that it leaves the predetermined frequency range around the nominal demodulation frequency.

In accordance with a further embodiment of the method according to the invention, a sound carrier is only detected when the measuring cycle results in a detection of a sound carrier and the amplitude of the input signal of the controllable amplifier is in a nominal amplitude range.

The reliability of detection can be enhanced by evaluating the amplitude of the input signal of the controllable amplifier and hence of the adjusted gain factor of the controllable amplifier, because the amplitude which an FM sound carrier should have at the input of the controllable amplifier is known. If a signal of this amplitude is not available, it can be concluded therefrom that an FM sound carrier is actually absent at the nominal demodulation frequency. The combination of the evaluation of signals of the FM demodulator in the manner described above and the adjusted gain of the amplifier enhance the detection reliability.

Those skilled in the art will understand the invention and additional objects and advantages of the invention by studying the description of preferred embodiments below with reference to the following drawings which illustrate the features of the appended claims:

DETAILED DESCRIPTION OF THE PREFERRED EMBODIMENTS

Figure 1:
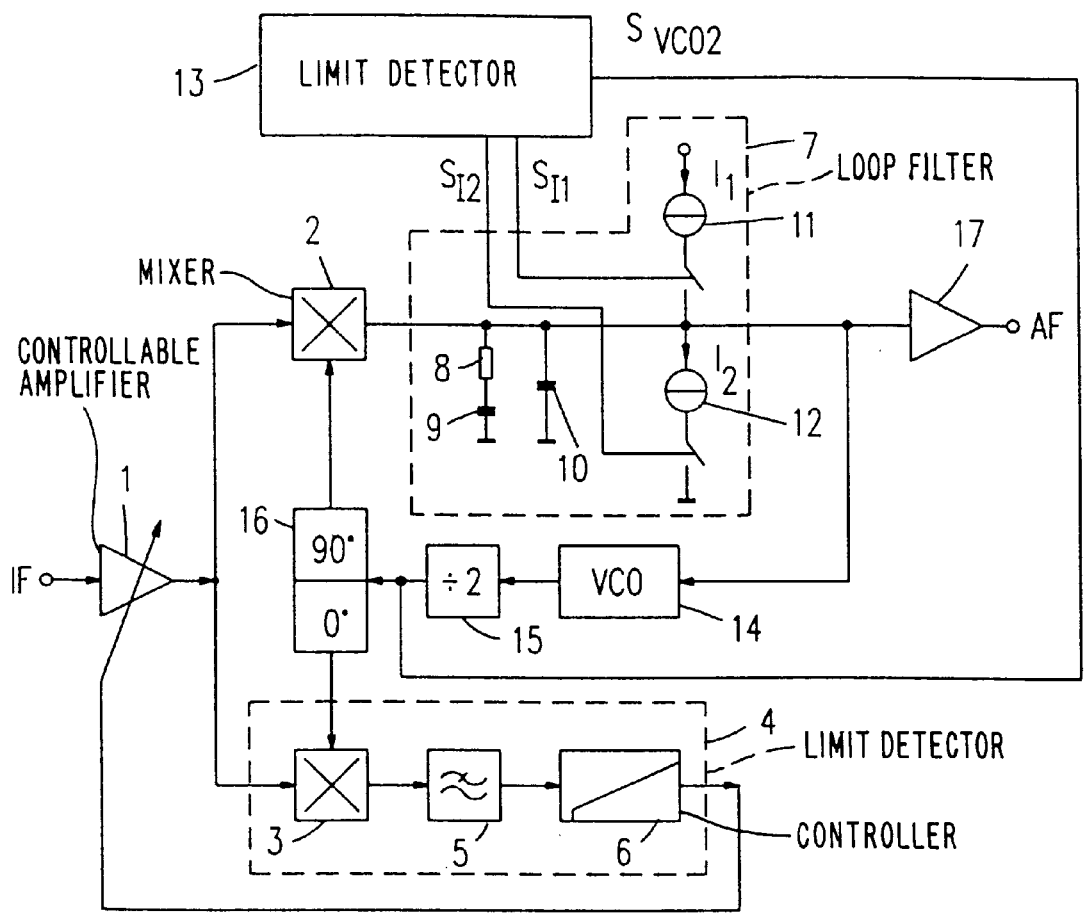
FIG. 1 is a block diagram of an FM demodulator according to the invention.

A block diagram in FIG. 1 shows the FM demodulator according to the invention whose input receives an intermediate-frequency picture signal which is denoted by IF in the Figure. This signal also comprises an FM sound signal. The FM demodulator should both filter and demodulate this signal.

The IF picture signal comprising the FM sound carrier is applied to the input of a controllable amplifier 1 whose output signal is applied to a first mixer 2 of a phase-locked loop and to a second mixer 3 of an amplitude control circuit 4.

The second mixer 3 of the amplitude control circuit 4 precedes a low-pass filter 5 and a PI control means 6. The output signal of the PI control means 6 also represents the output signal of the amplitude control circuit. The PI control means 6 performs a nominal/actual comparison on the signal applied thereto and its output supplies an adjusting signal to the controllable amplifier 1 whose gain is adjusted in such a way that the output amplitude of the controllable amplifier 1 has a predetermined nominal value.

In the phase-locked loop of the FM demodulator, the first mixer 2 precedes a loop filter 7 which comprises a second-order filter. This filter has a pole at the zero frequency and has thus an infinitely high DC gain. The second-order filter is composed of a resistor 8 and a capacitor 9 which are connected to a reference potential from the output of the second mixer. Parallel thereto, a second capacitor 10 is connected to this reference potential. In this filter, a positive current pulse can be supplied by means of a first current source 11 or a negative current pulse can be supplied by means of a second current source 12. The two current sources 11 and 12 are controlled by a limit-detection circuit 13 which supplies corresponding switching signals $S_{f1}$ or $S_{f2}$ for controlling the current sources 11 and 12, respectively.

Within the phase-locked loop, the loop filter 7 precedes a voltage-controlled oscillator 14. The output signal of this voltage-controlled oscillator is applied via a divider 15 to a phase shifter 16 which applies the signal without a phase shift to the second mixer 3 of the amplitude control circuit 4 and with a phase shift of 90° to the first mixer 2 of the phase-locked loop.

The output signal of the divider 15 is also applied to the limit-detection circuit 13.

Behind the loop filter 7, the oscillator signal of the FM demodulator is supplied and amplified by means of an amplifier 17 whose output supplies the demodulated sound signal which is denoted by AF in the Figure.

Figure 2:
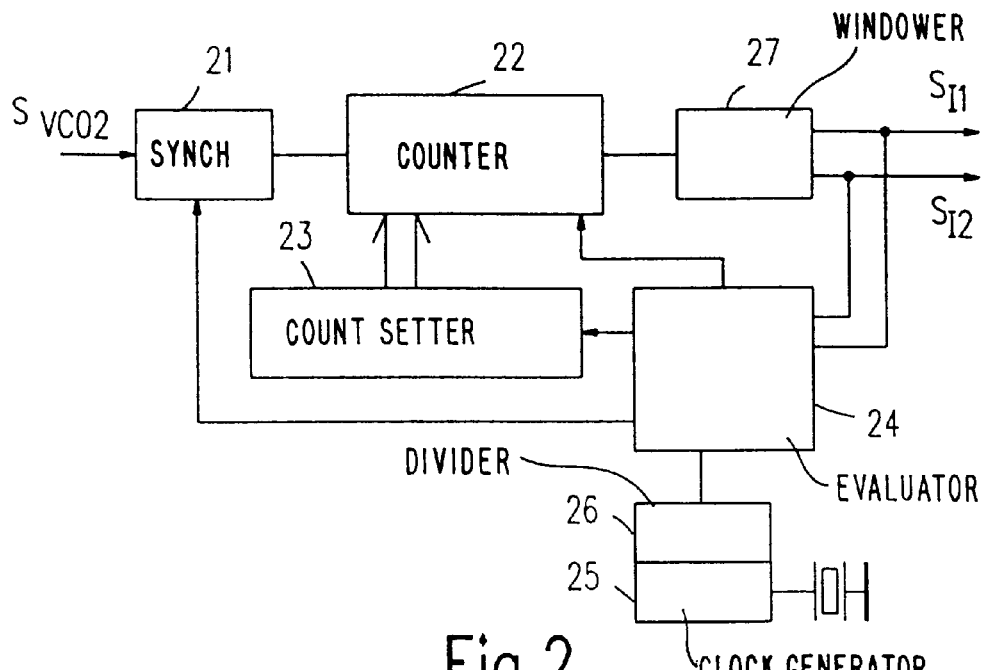
FIG. 2 is a block diagram of the limit-detection circuit of the FM demodulator of FIG. 1.

The limit-detection circuit 13 shown in the form of a block only in FIG. 1 is further shown in a block diagram in FIG. 2.

The limit-detection circuit in FIG. 2 receives the output signal from the divider 15 of the circuit in FIG. 1 at its input. This signal denoted as $S_{VCO2}$ is applied within the limit-detection circuit of FIG. 2 to a synchronizing circuit 21 which synchronizes the signal $S_{VCO2}$ with a measuring window signal from an evaluation logic 24 so as to guarantee a time window which is accurately defined with respect to time. To this end, a D-flipflop (not shown) is used, which prevents that the measuring window is ended between two pulses of the $S_{VCO2}$ signal.

The synchronizing circuit 21 precedes a counter 22 which can be set to a defined count by means of a counter-setting device 23. Both the counter-setting device 23 and the counter 22 are controlled by means of an evaluation logic. The counter 22 precedes a window logic 27 which performs an evaluation of the count and supplies the control signals $S_{f1}$ and $S_{f2}$ to the current sources 11 and 12 of the FM demodulator of FIG. 1. These signals are applied within the limit-detection circuit of FIG. 2 also to the evaluation logic 24.

The evaluation logic 24 is controlled by a clock generator 25 which may precede a divider 26.

The operation of the FM demodulator of FIG. 1 and the limit-detection circuit of FIG. 2 in this demodulator will hereinafter be described with reference to FIGS. 3 and 4.

The FM demodulator of FIG. 1 operates linearly because no limitation is performed in the controllable amplifier 1. Thus it has its own selectivity and does not require any ceramic filters for filtering given FM sound carriers. By means of the amplitude control circuit, the amplitude is controlled at a predetermined nominal amplitude at the output of the controllable amplifier 1.

The phase-locked loop comprising the mixer 2, the loop filter 7, the controllable oscillator 14, the divider 15 and the phase shifter 16 locks in on an operating frequency in conformity with an adjusted nominal demodulation frequency when there is actually an FM sound carrier present at this nominal demodulation frequency. Then, the phase-locked loop operates at this operating frequency.

However, if no FM sound carrier is present at the nominal demodulation frequency, the operating frequency moves to its upper or lower frequency limit in response to the infinitely high DC gain which, due to the second-order filter, occurs in the loop filter 7. This means that the operating frequency towards the upper limit or the lower limit moves away from a predetermined frequency range around the nominal demodulation frequency. This is detected by means of the limit-detection circuit 13.

The limit-detection circuit 13 shown in FIG. 2 includes a counter 22. In dependence upon the selected nominal demodulation frequency, this counter is set to an initial value at the start of a measuring cycle by means of the evaluation logic 24 and the counter-setting device 23. The height of this initial value is dependent on the height of the nominal demodulation frequency. The evaluation logic of the arrangement of FIG. 2 subsequently controls a measuring cycle in such a way that the counter 22 continues to count during the measuring cycle in dependence upon the signal $S_{VCO2}$ applied thereto. At the end of the measuring cycle, the count then reached is evaluated. Its height depends on the operating frequency of the phase-locked loop of the FM demodulator shown in FIG. 1.

When an FM sound carrier is actually present at the selected nominal demodulation frequency, the phase-locked loop locks in on this frequency. A corresponding frequency is supplied by the signal $S_{VCO2}$ to the counter 22 which continues to count in dependence upon this signal. When the phase-locked loop has locked in, the count of the counter 22 reaches a defined final value at the end of the measuring cycle. The evaluation logic 24 then detects that this count was reached and that thus an upper limit value of the count is not exceeded and that the count of the counter 22 does not fall below a lower limit value. In response thereto, the window logic 27 does not supply a control signal $S_{r1}$ or $S_{r2}$ to the current sources. The circuit operates in a stable manner; the phase-locked loop has locked in on the nominal demodulation frequency and a subsequent control by the limit-detection circuit is not required.

However, if there is actually no FM sound carrier present at the nominal demodulation frequency, the operating frequency of the phase-locked loop of the FM demodulator in FIG. 1 moves to the upper or lower limit frequency of the phase-locked loop in response to the infinitely high DC gain of the loop filter. For the limit-detection circuit of FIG. 2, this means that the frequency $S_{VCO2}$ moves to the upper or the lower value and has clearly higher or lower values than in the locked-in state of the phase-locked loop. This in turn means that the count of the counter 22 has a clearly higher or lower value than the nominal final value after a measuring cycle. This is detected by means of the window logic 27. When the count is higher than the upper limit value, the second current source is controlled by means of the control signal $S_{r2}$. If the final value of the count is below the lower limit value, the first current source of the FM demodulator of FIG. 1 is controlled by means of the control signal $S_{r1}$.

The fact that after a measuring cycle, one of the two control signals $S_{r1}$ or $S_{r2}$ is released by the window detection circuit 27 is detected by the evaluation logic 24. The occurrence of one of the signals means that the phase-locked loop of the FM demodulator of FIG. 1 has not locked in on its nominal demodulation frequency.

This already shows that it is most likely that there is actually no FM sound carrier present at the nominal demodulation frequency. To enhance the reliability of this detection, the measuring process may be repeated in several subsequent, equally proceeding measuring cycles. For example, if ten measuring cycles always show the result that no FM sound carrier is present, meaning that the control signals $S_{r1}$ or $S_{r2}$ occur after each measuring cycle, then it is detected with certainty that no FM sound carrier is present at this frequency. The evaluation logic 24 can then select a new nominal demodulation frequency at which an FM sound carrier is suspected to be present. In a corresponding manner, it controls the counter-setting device 23 which sets the initial count of the counter 22 to a value corresponding to this new nominal demodulation frequency. Subsequently, the above-described process is repeated for this new nominal demodulation frequency.

To detect an FM sound carrier and hence the television standard used, a new nominal demodulation frequency and hence a new suspected FM sound carrier frequency is selected by means of the evaluation logic 24 until an FM sound carrier is actually found at this frequency. When an FM sound carrier has actually been detected in one or advantageously more measuring cycles, a selection of new nominal demodulation frequencies is no longer necessary and the output of the FM demodulator of FIG. 1 supplies the demodulated sound signal which is available for further processing.

Figure 3:
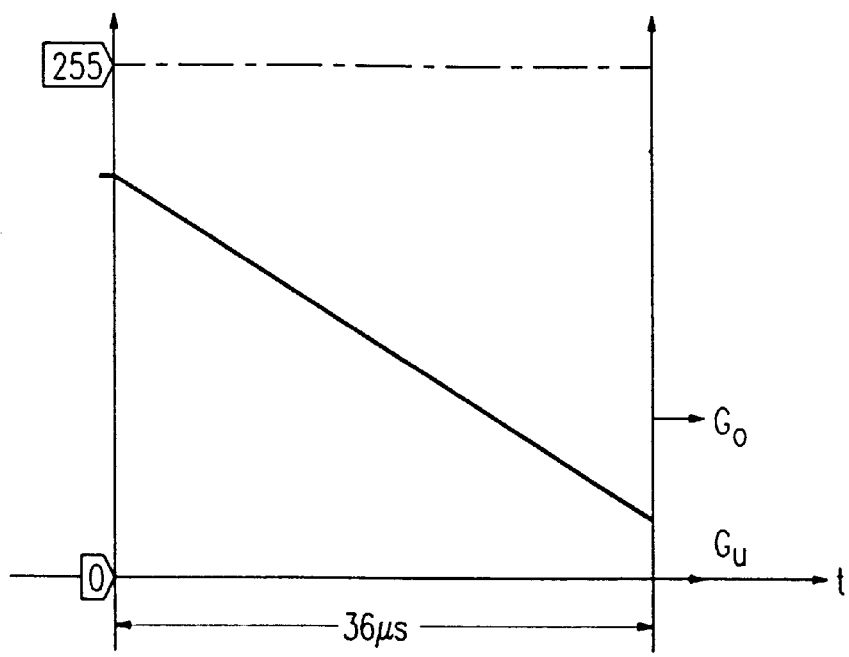
FIG. 3 shows diagrammatically the count of the counter of the limit-detection circuit of FIG. 1.

In FIG. 3, the continuing count, during a measuring cycle, of the counter 22 of the limit-detection circuit shown in FIG. 2 is shown as a function of time in FIG. 3.

In the example of FIG. 3, the length of the measuring cycle is 36 µs. At the start of the measuring cycle, the counter is set to a count whose value depends on the selected nominal demodulation frequency. During the measuring cycle, the counter counts down so that its count steadily decreases as is shown in FIG. 3. At the end of the measuring cycle, the counter reaches its final value. When the count corresponds to the nominal value, the phase-locked loop is locked in on the nominal demodulation frequency. This case is shown in FIG. 3.

When there is actually no FM sound carrier at this frequency, the count shown in FIG. 3 would exceed the upper limit value $G_O$, or fall below the lower limit value $G_U$. This would happen if the phase-locked loop moved to its upper or lower frequency in response to the infinitely high gain of its loop filter and the counter 22 of the limit-detection circuit of FIG. 2 received a correspondingly high-frequency or low-frequency signal so that the counter clearly counts at a faster or slower rate and its final count at the end of the measuring cycle exceeded the upper limit value $G_O$ or fell below the lower limit value $G_U$, respectively.

When the counts exceed or fall below the limit values in this way, the window logic 27 of the limit-detection circuit of FIG. 2 supplies control signals $S_{r1}$ and $S_{r2}$ to the current sources 11 and 12 of the loop filter 7 of the FM demodulator shown in FIG. 1.

Figure 4:
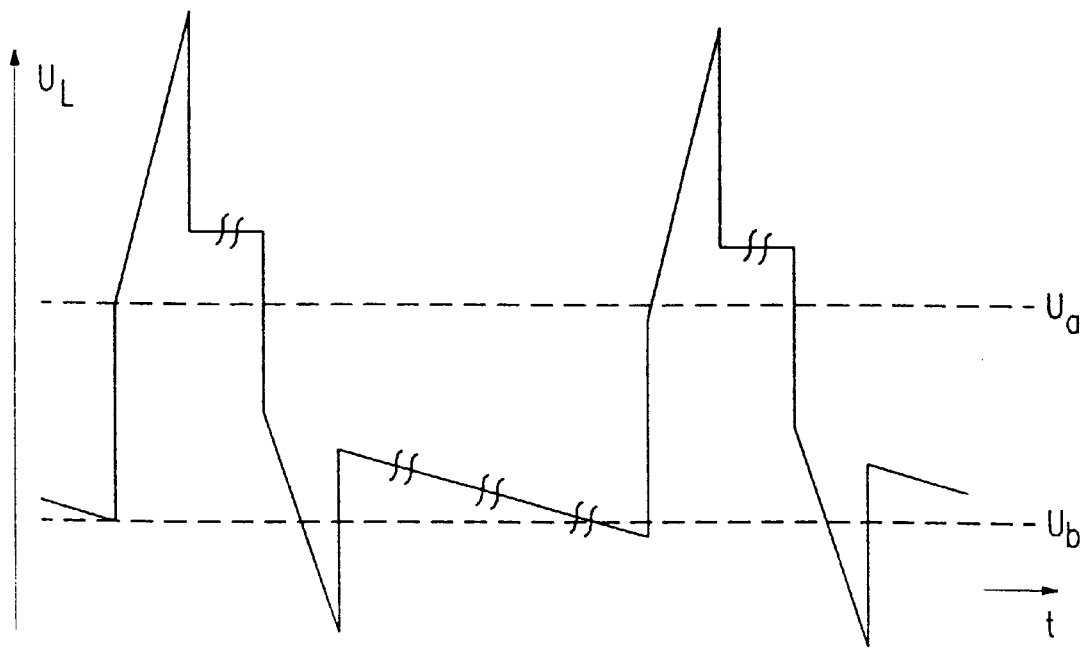
FIG. 4 shows the variation with respect to time of the voltage drop across the filter of the loop filter of the FM demodulator shown in FIG. 1.

The voltage ratios adjusting in such a non-synchronized state of the phase-locked loop at the filter of the loop filter 7 of the FM demodulator shown in FIG. 1 are shown as a function of time in FIG. 4.

In this case, it is fundamental that the voltage ratios shown in FIG. 4 at the filter of the loop filter 7 are directly proportional to the operating frequency of the phase-locked loop because the voltage-controlled oscillator 14 adjusts the frequency of its output signal directly in dependence upon this voltage.

At the start of the curve in FIG. 4, the count of the counter 22 of the limit-detection circuit 13 falls below the lower limit value. With reference to FIG. 3, this means that the final value of the count is below the value $G_U$. The window logic 27 thereupon controls the current source 11 of the loop filter 7 by means of the control signal $S_{r1}$. This means that the voltage across the filter of the loop filter 7, i.e. across the parallel circuit consisting of the second capacitor 10 and the series arrangement consisting of the resistor 8 and the first capacitor 9 increases. In response to the voltage drop across the resistor 8, a proportional component occurs which, in FIG. 4, results in the voltage increasing from the value $U_a$ to the value $U_b$. A voltage drops off across the capacitors 9 and 10, which voltage supplies an integral component leading to a further increase of the voltage above the value $U_b$.

Since the current source 11 is controlled only for a short time, the voltage drops off again after the current source is switched off. It does not completely reach the value $U_a$ but is above this value. When, after this switch-off, a measurement within a measuring cycle is performed again, it is detected that the operating frequency of the phase-locked loop lies above the nominal demodulation frequency. In response thereto, the second current source $S_{f2}$ is controlled by means of the limit-detection circuit 13. As is shown in FIG. 4, the result is that the voltage initially drops off by a proportional part and subsequently by an integral part. After the second current source 12 has been switched off, the voltage is again within the range between $U_a$ and $U_b$ and thus within the predetermined frequency range around the nominal demodulation frequency.

However, if no FM sound carrier is present at this frequency, likewise as before, the voltage further drops off in this case until it has fallen below the value $U_b$ and would thus move away from the predetermined frequency range around the nominal demodulation frequency to a lower value. This is detected in the evaluation logic of FIG. 2 by the final count reached, and the first current source is again controlled by means of the control signal $S_{f1}$ so that the process shown at the start of the diagram in FIG. 4 is repeated.

When no sound carrier is further present at the selected nominal demodulation frequency, this process would be infinitely often repeated. Alternately, possibly with pauses, the two current sources 11 and 12 of the phase-locked loop of the FM demodulator shown in FIG. 1 would be controlled by the window logic 27 of the limit-detection circuit of FIG. 2. In this case, however, the evaluation logic 24 would detect that, for example within ten measuring cycles, the control sources are controlled again and again and a new nominal demodulation frequency would be selected and, in dependence upon its value, would cause the counter-setting device 23 to select a new initial count for a measuring cycle. The process would be further repeated for this new nominal demodulation frequency. When a sound carrier is detected at the nominal demodulation frequency, the search process can be stopped. Otherwise, a new nominal demodulation frequency is selected and the counter 22 is set to a corresponding initial value for which the measuring process is repeated.

This measuring process is repeated for new nominal demodulation frequencies until an FM sound carrier is found.

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims.

I claim:

1. An FM demodulator for demodulating FM sound signals of a picture signal, preferably an IF picture signal, including a phase-locked loop, comprising: a controllable amplifier which receives the sound signals converted to intermediate frequencies, said amplifier having a gain which is adjusted by an amplitude control circuit and whose output signal is applied to the amplitude control circuit and to the phase-locked loop which supplies a demodulated sound signal in the locked-in state from its output, a loop filter of at least the second order with a pole at the frequency f=0, and a limit-detection circuit which feeds back the operating frequency of the phase-locked loop to a predetermined frequency range when said phase-locked loop leaves this frequency range around a predeterminable nominal demodulation frequency, and in which the amplitude control circuit controls the controllable amplifier depending upon its output signal and a signal dependent on the frequency of the output signal of a voltage-controlled oscillator in the phase-locked loop in such a way that the output signals of the controllable amplifier have a nominal amplitude.

2. An FM demodulator as claimed in claim 1, in which:

two current sources can supply currents of different signs and different values to the loop filter; and when the operating frequency of the phase-locked loop leaves the frequency range around the nominal demodulation frequency, the limit-detection circuit controls the current sources in such a way that the operating frequency of the phase-locked loop is fed back again to the predetermined frequency range around the nominal demodulation frequency.

3. An FM demodulator as claimed in claim 1 in which the limit-detection circuit includes an adjustable counter which, at the start of a measuring cycle, is set at an initial value dependent on the nominal demodulation frequency and, during the measuring cycle, continues to count in dependence upon the phase-locked loop signal, and an evaluation logic which, after the measuring cycle, controls the current sources depending upon the count reached by the counter.

4. An FM demodulator as claimed in claim 3, in which:

the current source supplying a positive current pulse to the loop filter is activated by the evaluation logic during a predetermined period of time in the case where the count falls below a predetermined lower limit value after the measuring cycle has finished, and the current source supplying a negative current pulse to the loop filter is activated by the evaluation logic during a predetermined period of time in the case where the count exceeds a predetermined upper limit value after the measuring cycle has finished.

5. A picture display device including an FM demodulator for demodulating FM sound signals of a picture signal, preferably an IF picture signal, including a phase-locked loop, comprising:

a controllable amplifier which receives the sound signals converted to intermediate frequencies, said amplifier having a gain which is adjusted by an amplitude control circuit and whose output signal is applied to the amplitude control circuit and to the phase-locked loop which supplies a demodulated sound signal in the locked-in state from its output, a loop filter of at least the second order with a pole at the frequency f=0, and a limit-detection circuit which feeds back the operating frequency of the phase-locked loop to a predetermined frequency range when said phase-locked loop leaves this frequency range around a predeterminable nominal demodulation frequency, and in which, the amplitude control circuit controls the controllable amplifier depending upon its output signal and a signal dependent on the frequency of the output signal of a voltage-controlled oscillator in the phase-locked loop in such a way that the output signals of the controllable amplifier have a nominal amplitude.

6. A method of detecting FM sound carriers of different FM carrier frequencies in an FM picture signal, preferably an IF-FM picture signal, compromising the steps of:

controlling an FM demodulator to detect an FM sound carrier: at a nominal demodulation frequency in such a way that an FM sound carrier at the nominal demodulation frequency is detected in the case where the limit-detection circuit detects that the operating frequency of the phase-locked loop does not leave the predetermined frequency range around the nominal demodulation frequency, and controlling the FM demodulator to detect the FM sound carrier at another nominal demodulation frequency in the case where the limit-detection circuit detects that the operating frequency of the phase-locked loop leaves the predetermined frequency range around the nominal demodulation frequency.

7. A method as claimed in claim 6, in which the detection process is performed successively for all relevant FM sound carrier frequencies and nominal demodulation frequencies until an FM sound carrier is detected.

8. A method as claimed in claim 6, in which a predetermined number of, preferably ten, measuring cycles is performed without evaluation of the results before the decisive detection measuring cycle is performed, whose result is evaluated.

9. A method as claimed in claim 6, in which a sound carrier is only detected when the measuring cycle results in a detection of a sound carrier and the amplitude of the input signal of the controllable amplifier is in a nominal amplitude range.

* * * * *